(12) United States Patent
Herold

(10) Patent No.: US 7,966,579 B2
(45) Date of Patent: Jun. 21, 2011

(54) METHODS OF OPTICAL PROXIMITY CORRECTION

(75) Inventor: Klaus Herold, Poughquag, NY (US)

(73) Assignee: Infineon Technologies AG, Munich (DE)

( * ) Notice: Subject to any disclaimer, the term of this patent is extended or adjusted under 35 U.S.C. 154(b) by 1066 days.

(21) Appl. No.: 11/499,610

(22) Filed: Aug. 4, 2006

(65) Prior Publication Data
US 2008/0032204 A1 Feb. 7, 2008

(51) Int. Cl.
*G06F 17/50* (2006.01)
(52) U.S. Cl. ............... 716/50; 716/51; 716/52; 716/53; 716/54
(58) Field of Classification Search .............. 716/19–21, 716/50–55; 430/5, 22, 30; 359/290–291
See application file for complete search history.

(56) References Cited

U.S. PATENT DOCUMENTS

| | | | | |
|---|---|---|---|---|
| 2003/0082461 A1* | 5/2003 | Carpi | .................. | 430/5 |
| 2005/0076322 A1* | 4/2005 | Ye et al. | ............ | 716/20 |
| 2005/0168498 A1* | 8/2005 | Granik | ............ | 345/698 |
| 2007/0028206 A1* | 2/2007 | Chou et al. | ............ | 716/21 |
| 2007/0198964 A1* | 8/2007 | Al-Imam et al. | ............ | 716/21 |
| 2007/0209029 A1* | 9/2007 | Ivonin et al. | ............ | 716/19 |

OTHER PUBLICATIONS

"Optical Proximity Correction," Wikipeida, the free encyclopedia, http://en.wikipeida.org/wiki/Optical_proximity_correction, downloaded Jul. 13, 2006, 2 pp., Wikimedia Foundation, Inc., St. Petersburg, FL.
Wolf, S., et al., "Silicon Processing for the VLSI Era: vol. 1: Process Technology," 2nd Ed., 2000, p. 628-630, Lattice Press, Sunset Beach, CA.

* cited by examiner

*Primary Examiner* — Paul Dinh
(74) *Attorney, Agent, or Firm* — Slater & Matsil, L.L.P.

(57) ABSTRACT

Systems and methods of optical proximity correction are disclosed. A preferred embodiment comprises a method of determining optical proximity correction, which includes providing a design for a lithography mask. The design comprises a layout for a material layer of a semiconductor device. A predicted wafer image producible by the design for the lithography mask is calculated, and an amount of error between a target image and the calculated predicted wafer image is measured over a plurality of pixels of the predicted wafer image. The plurality of pixels comprises a plurality of different sizes.

30 Claims, 6 Drawing Sheets

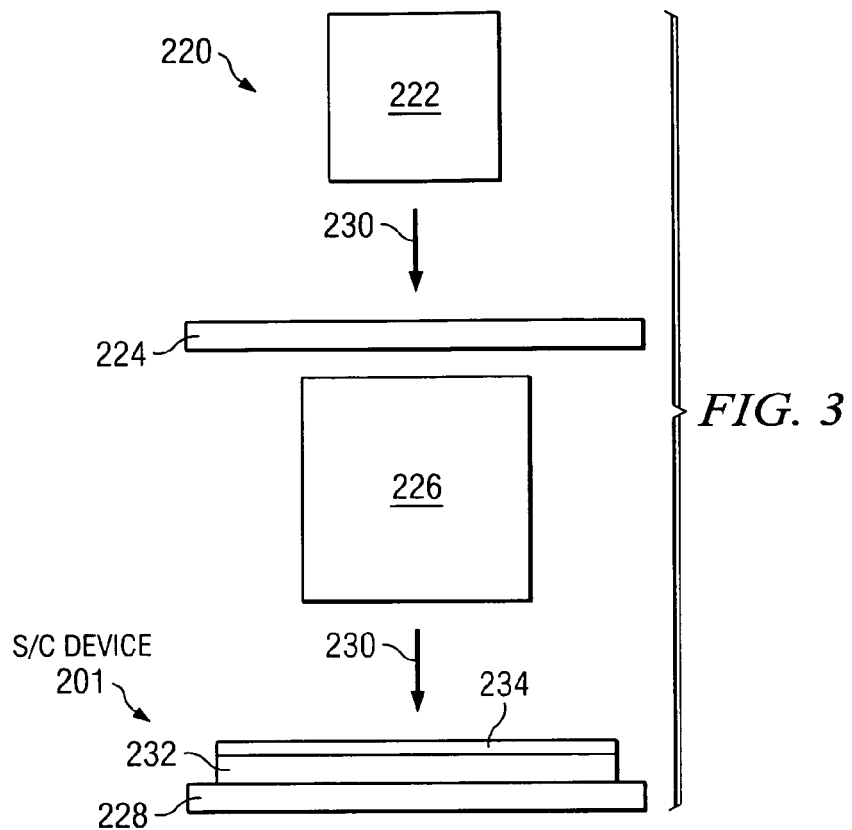
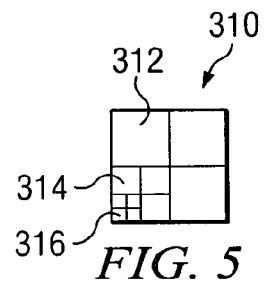
FIG. 5
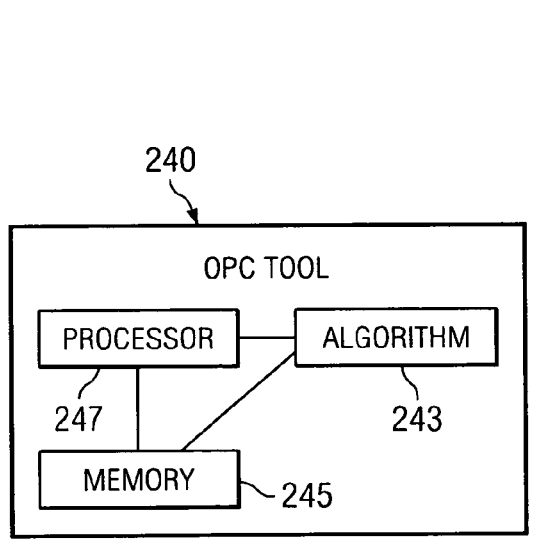
FIG. 4
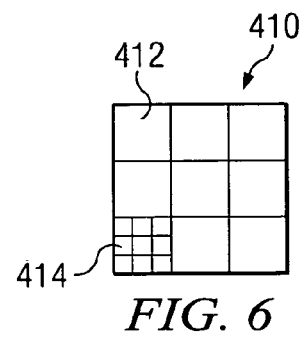
FIG. 6

METHODS OF OPTICAL PROXIMITY CORRECTION

TECHNICAL FIELD

The present invention relates generally to the fabrication and design of semiconductor devices, and more particularly to optical proximity correction for lithography masks.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip, for example.

Lithography involves transferring an image of a mask to a material layer of a wafer. The image is formed in a layer of photoresist, the photoresist is developed, and the photoresist is used as a mask during a process to alter the material layer, such as etching and patterning the material layer.

As feature sizes of semiconductor devices continue to decrease, as is the trend in the semiconductor industry, transferring patterns from a lithography mask to a material layer of a semiconductor device becomes more difficult, due to the effects of the light or energy used to expose the photoresist. A phenomenon referred to as the proximity effect results in the line width of patterns varying, depending the proximity of a feature to other features. Closely-spaced features tend to be smaller than widely-spaced features, although on a lithography mask they comprise the same dimension, as an example. It is important in many semiconductor device designs for features to have uniform, predictable dimensions across a surface of a wafer, for example, to achieve the required device performance.

To compensate for the proximity effect, optical proximity corrections (OPC) are often made to lithography masks, which may involve adjusting the widths or lengths of the lines on the mask. More advanced methods of OPC correct corner rounding and a general loss of fidelity in the shape of features by adding small secondary patterns referred to as serifs to the corners of patterns. The serifs, together with line width changes, enhance the amount of light transmitted through the transparent mask patterns.

The OPC design phase is time-consuming, and therefore costly. Often, it is desirable to introduce a product as quickly as possible to the market in the semiconductor device industry. However, it may take two or three weeks for OPC calculations to be performed on a semiconductor device design, for example.

Thus, what are needed in the art are faster and more efficient methods of calculating and determining OPC for lithography masks of semiconductor devices.

SUMMARY OF THE INVENTION

These and other problems are generally solved or circumvented, and technical advantages are generally achieved, by preferred embodiments of the present invention, which provide novel methods of determining optical proximity correction (OPC) for semiconductor devices.

In accordance with a preferred embodiment of the present invention, a method of determining optical proximity correction includes providing a design for a lithography mask. The design comprises a layout for a material layer of a semiconductor device. A predicted wafer image producible by the design for the lithography mask is calculated, and an amount of error between a target image and the calculated predicted wafer image is measured over a plurality of pixels of the predicted wafer image. The plurality of pixels comprises a plurality of different sizes.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 shows a lithography system that may be used to pattern a material layer of a semiconductor device in accordance with an embodiment of the present invention;

FIG. 4 shows a block diagram of an OPC tool that may be used to determine optical proximity corrections in accordance with an embodiment of the present invention;

FIG. 5 illustrates that the pixel size may be successively decreased by one quarter in accordance with an embodiment of the present invention;

FIG. 6 illustrates that the pixel size may be successively decreased by one third of a side of a pixel in accordance with an embodiment of the present invention;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In conventional methods, optical proximity correction is often determined using what is referred to as "sparse" OPC. In sparse OPC, a chip is designed, and image parameters are fragmented at controlled placement sites along the edges of features. Edge placement error (EPE) is measured at each control site at the edges of features, and the edge is moved for each control site if needed. The control sites are usually located at corners and at predetermined spaced-apart locations along the edges of the features. The EPE measurement and edge movement is repeated for several iterations, and then a lithography mask design is determined that includes the post OPC design.

However, sparse OPC is not very accurate and in some applications is not capable of making optical proximity corrections to the accuracy target for some semiconductor devices and/or lithography processes, for example.

A more recent form of optical proximity correction in use is referred to as dense OPC. In dense OPC, a pixel size is defined, and portions of the calculated aerial image are examined and analyzed to determine OPC, pixel by pixel. An OPC tool which includes measurement systems and software is used to place a global grid of the pixels over a design layout and then calculate the image parameters for each pixel. The image parameters are compared to the target image to determine the amount of correction. A small pixel size is required to achieve high accuracy, which results in extensive or increased run times. If a large pixel size is used, a faster run time is achieved, but at the cost of low accuracy.

Figure 1:
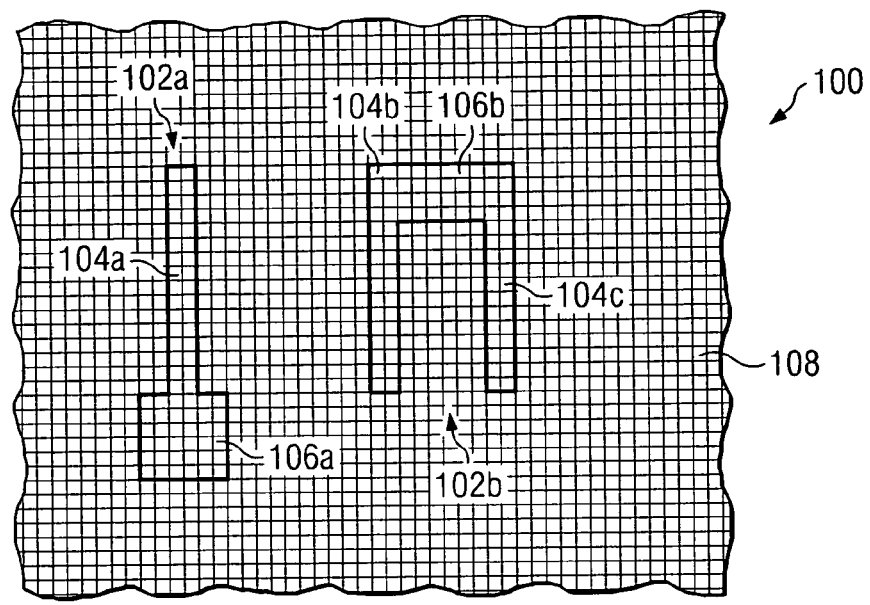
FIG. 1 illustrates a prior art method of determining optical proximity correction that is time-consuming.

With reference now to FIG. 1, there is shown a prior art method of determining optical proximity correction that is very time-consuming. A dense OPC method is shown, wherein a plurality of very small pixels 108, e.g., comprising a size of about 20 nm×20 nm, are used to determine optical proximity corrections. A design layout 100 is shown comprising patterns 102a and 102b. The pixels 108 comprise a plurality of small discrete elements that together constitute an image of the lithography mask, e.g., a pattern for a material layer of a semiconductor device.

The mask design may include patterns 102a and 102b for features, as shown. Pattern 102a may comprise a conductive line portion 104a and a contact pad portion 106a, and pattern 102b may comprise two conductive line portions 104b and 104c connected by a contact pad portion 106b, as shown.

There may hundreds or thousands of patterns 102a and 102b on a single design layout 100, not shown, comprising a variety of different sizes and shapes, for example.

To determine OPC, an OPC tool is used to examine portions of a calculated aerial image compared to the target image for each pixel 108 to determine the amount of correction to make on the mask design for each pattern 102a and 102b for features. Because of the large number of pixels 108, it is not uncommon for OPC calculations using dense OPC to take several weeks for an analysis of a design layout for a single layer of material, for example. Thus, what are needed in the art are improved and faster methods of determining OPC.

Embodiments of the present invention achieve technical advantages by providing novel methods of determining OPC using dense OPC, wherein multiple sizes of pixels are used to determine the optical proximity corrections. Small pixels are used close to the edges and corners of features, and larger pixels are used in areas where there are no features present. By using different sized pixels for the OPC analyses and calculations, less time is required to run the OPC analyses and calculations.

The present invention will be described with respect to preferred embodiments in a specific context, namely in optical proximity correction methods for lithography masks used in the fabrication of material layers of semiconductor devices. Embodiments of the invention may also be applied, however, to other applications where lithography masks are used to transfer a pattern to a surface, for example.

Figure 2:
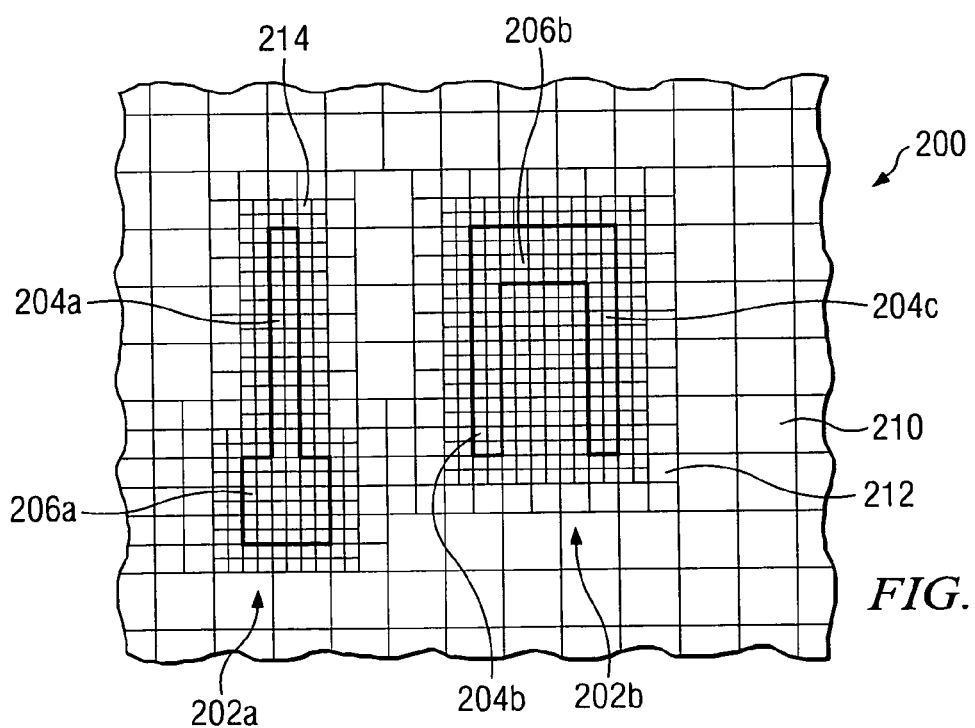
FIG. 2 illustrates a method of determining optical proximity correction in accordance with a preferred embodiment of the present invention, wherein different pixel sizes are used.

FIG. 2 illustrates a method of determining optical proximity correction in accordance with a preferred embodiment of the present invention, wherein different pixel 210, 212, and 214 sizes are used for the OPC analysis. Like numerals are used for the various elements that were used to describe FIG. 1, and to avoid repetition, each reference number shown in FIG. 2 is not described again in detail herein.

Advantageously, the design layout 200 is first divided up into large pixels 210. An analysis is performed of the large pixels 210 to determine if each of the large pixels 210 contains at least a portion of a pattern 202a and 202b. If at least a portion of a pattern 202a and 202b is detected in a large pixel 210, then that pixel 210 is further analyzed by dividing that pixel 210 into medium sized pixels 212, and the medium pixels 212 are analyzed to either perform optical proximity correction calculations and/or analysis, or to determine if the medium pixels 212 should be further divided into smaller pixels 214, for further calculations and/or analysis, to be described further herein.

FIG. 3 shows a lithography system 220 that may be used to pattern a material layer of a semiconductor device 201 in accordance with an embodiment of the present invention. The lithography system 220 includes an illuminator 222 and a lens system 226. A lithography mask 224 is disposed between the illuminator 222 and the lens system 226. A semiconductor device (S/C) 201 is patterned by disposing a layer of photosensitive material 234 over a workpiece 232, placing the semiconductor device 201 on a support 228, and directing light or energy 230 from the illuminator 222 through the mask 224 and lens system 226 towards the semiconductor device 201. A pattern from the lithography mask 224 is transferred to the layer of photosensitive material 234 on the workpiece 232. The layer of photosensitive material 234 is developed, and then the layer of photosensitive material 234 is used as a mask while the workpiece 232 is altered or affected, e.g., while a material layer is patterned, etched away, deposited, or implanted with a substance such as a dopant, as examples. Embodiments of the present invention may be used to design a lithography mask 224 and may be used to fabricate semiconductor devices 201, for example.

FIG. 4 shows a block diagram of an OPC tool 240 that may be used to determine optical proximity corrections in accordance with embodiments of the present invention. The OPC tool 240 includes an algorithm 243 adapted to perform OPC at multiple size pixels in accordance with an embodiment of the present invention. The OPC tool 240 includes a memory 245 or storage adapted to store the lithography mask design layout and OPC calculations determined. The OPC tool 240 includes a processor 247 adapted to perform the OPC calculations and make comparisons of calculated aerial images with targeted features. The OPC tool 240 may also include other subsystems and devices, not shown, such as operator interface equipment, as an example. Embodiments of the present invention are implementable in OPC tools 240 manufactured by companies such as Mentor Graphics, Brion, and Synopsis, as examples.

In accordance with one embodiment, a system 240 for designing a layout of a material layer of a semiconductor device includes the memory 245 adapted to store the layout or design, an algorithm 243 for determining optical proximity corrections over a plurality of pixels of the layout, the plurality of pixels comprising a plurality of different sizes, and a processor 247 for performing optical proximity correction calculations in accordance with the algorithm 243 and for adjusting the layout in accordance with the optical proximity corrections determined. The system 240 may comprise an OPC tool or a design for manufacturing (DFM) type of system. The algorithm 243 is adapted to generate a grid of the plurality of pixels and apply the grid to the layout. The plurality of pixels may comprise a first size proximate the plurality of patterns and a second size spaced apart from the plurality of patterns, the first size being smaller than the second size; e.g., in FIG. 2, pixels 212 and 214 proximate the patterns 202a and 202b are smaller than pixels 210 spaced apart from the patterns 202a and 202b.

FIG. 5 illustrates that the pixel size of the OPC calculations in accordance with an embodiment of the present invention may be successively decreased in ¼ (one quarter) increments. Again, like numerals are used for the various elements that were described in the previous figures. For example, the large pixels 310 for the first OPC pass may comprise about 120 nm on each side, e.g., the pixels 310 may comprise squares having equal length sides of about 120 nm. On the second OPC pass, the large pixels 310 are divided into quarters into medium pixels 312, as shown, e.g., having equal length sides of about 60 nm. The sides of the pixels 310 may be halved, for example, as shown. On a third OPC pass, the medium pixels 312 are divided further into quarters, into small pixels 314 having equal length sides of about 30 nm. Depending on the accuracy desired, the small pixels 314 may be further divided into quarters and into smaller pixels 316, as shown, having sides of equal length of about 15 nm. The more accurate OPC calculations are performed at edge and corner regions of patterns for features (e.g., such as patterns 202a and 202b shown in FIG. 2) using at least medium pixels 312, and optionally also the small pixels 314, and/or smaller pixels 316, depending on the accuracy level desired.

The pixels may also be decreased in size by other amounts in accordance with embodiments of the present invention. As another example, FIG. 6 illustrates that the size of a pixel side may be successively decreased by one third in accordance with an embodiment of the present invention. Large pixels 410 may be divided into ninths into medium pixels 412, and the medium pixels 412 may be further divided into ninths into small pixels 414, as shown. Likewise, the large pixels 310 and 410 shown in FIGS. 5 and 6 may be made smaller using other methods of division, for example.

Figure 7:
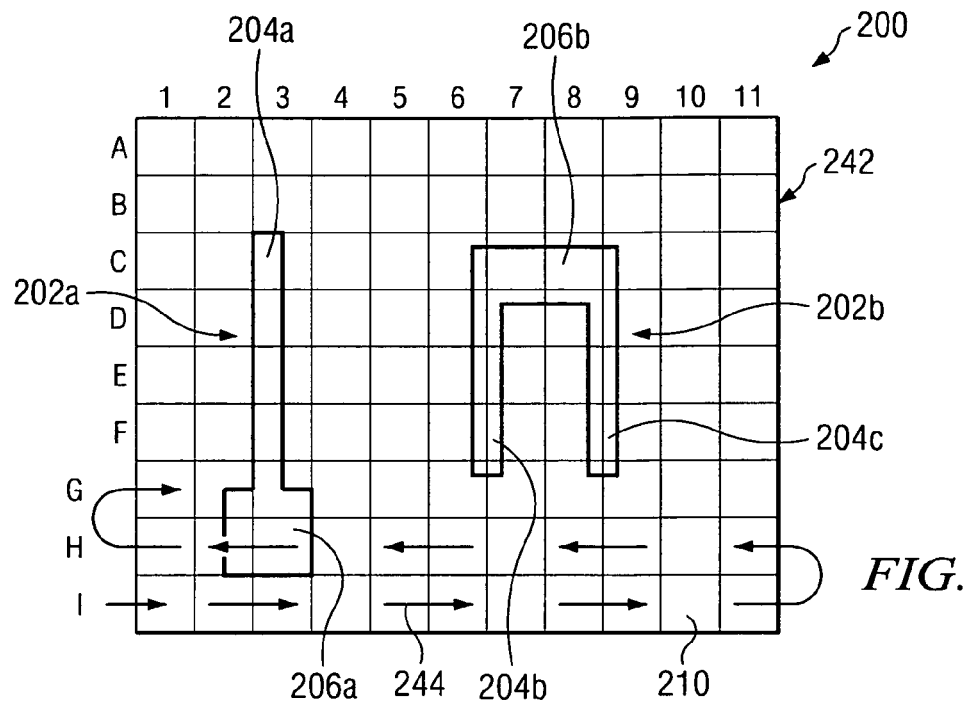
FIG. 7 shows an embodiment of the present invention, wherein an entire design layout is scanned from left to right and then back to the left again first using a large pixel size.
Figure 8:
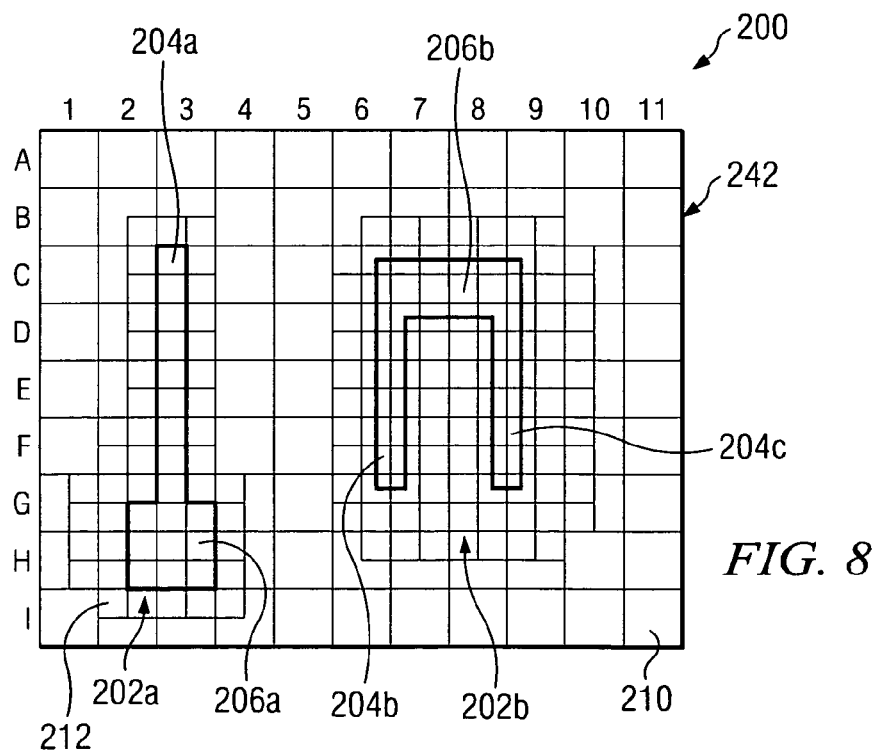
FIG. 8 illustrates that a smaller pixel size may be used for calculations proximate areas where features reside after the scanning operation at a larger pixel size shown in FIG. 7.
Figure 9:
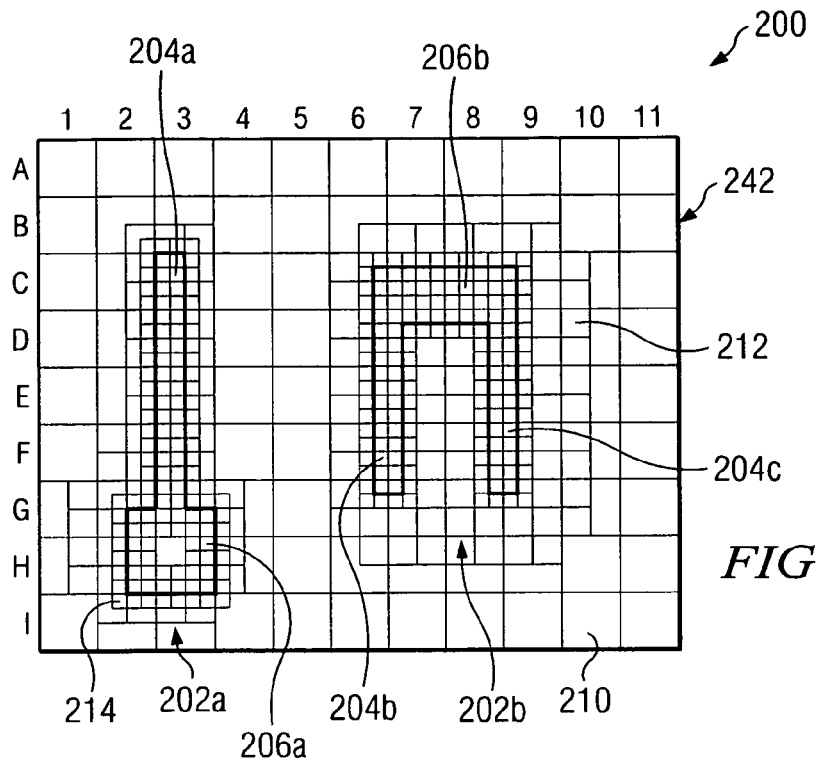
FIG. 9 illustrates that an even smaller pixel size may be used for calculations proximate the edges of the features after the operation shown in FIG. 8.

FIGS. 7 through 9 illustrate an algorithm 243 (see FIG. 4) for determining OPC in accordance with an embodiment of the present invention, wherein a design layout for a material layer of a semiconductor device is first analyzed using a large pixel 210 size for the entire design layout, and then further analysis of the large pixels 210 having patterns formed therein is performed at smaller pixel sizes 212 and/or 214. First, the design layout is stored in a memory 245 of the OPC tool 240 (see FIG. 4). The OPC tool 240 calculates an image pattern that would result from the design layout, e.g., at a particular threshold level, intensity, and slope. Referring to FIG. 7, then, the calculated design layout (e.g., of the calculated aerial image) is divided into an array 242 comprising a grid of a plurality of large pixels 210. The large pixels 210 may comprise squares having sides of about 100 to 200 nm, for example, although the large pixels 210 may also comprise other sizes. The entire design layout is scanned by an OPC tool 240 (such as the OPC tool shown in FIG. 4) from left to right in a direction 244, pixel 210 by pixel 210, to determine whether a portion of a pattern 202a and 202b resides within each pixel 210. When the right edge of the array 242 is reached, the OPC tool 240 moves up a row and returns across from right to left, again scanning each pixel 210 in the row.

The OPC tool 240 preferably starts at the lower left corner of the array 240 and moves to the right in most systems, as shown at 244, although other starting points and directions of movement may also be used. If a pattern 202a or 202b is found within the pixel 210, then that pixel 210 location is stored, e.g., in the memory 245 of the OPC tool 240. The "scanning" process occurs in the processor 247 of the OPC tool 240, e.g., in software, for example. The algorithm 243 is stored in the OPC tool 240, e.g., and may be stored in the memory 245.

After the large pixels 210 are analyzed, then further analysis of the large pixels 210 is performed by dividing the large pixels 210 into smaller pixels and performing a more detailed analysis. For example, FIG. 8 illustrates the use of a medium pixel 212 size for calculations proximate areas where patterns 202a and 202b reside after the scanning operation of FIG. 7. Medium pixels 212 are preferably defined proximate the patterns 202a and 202b. For example, in FIG. 7, large pixel C3 contains a portion of a pattern 202a. In FIG. 8, medium pixels 212 are defined in the entire pixel C3 and also for ½ of a pixel C2 and B3 which are adjacent the pixel C3 containing the portion of the pattern 202a. A medium pixel 212 may also be defined adjacent the corner of the large pixel C3, as shown at B2, for example. Based on the proximity within the large pixel C3 to adjacent large pixels 210, adjacent large pixels 210 may have medium pixels 212 defined in them, for example.

The algorithm 243 locates the portions of the patterns 202a and 202b that require optical proximity correction, namely, the edges of the patterns 202a and 202b, defines smaller pixels proximate the edges of the patterns 202a and 202b, and then performs detailed optical proximity correction calculations in the smaller pixels defined. For example, in FIG. 8, after the medium pixels 212 proximate the edges of the patterns are defined, then OPC calculations may then be performed, pixel 212 by pixel 212. However, if more accuracy is required in the OPC calculations, then the medium pixels 212 may be further divided into small pixels 214, as shown in FIG. 9, proximate the edges of the patterns 202a and 202b. OPC calculations may then be performed, pixel 214 by pixel 214.

Because the OPC calculations are performed only for the small pixels 214 in FIG. 9 (or medium pixels 212 in FIG. 8), the time for the OPC calculations is reduced. For example, small pixels 214 may not be defined in the center of the contact pad region 206a of pattern 202a, as shown, because the center of the contact pad region 206a does not contain an edge region of the pattern 202a. Small pixels 214 are also not defined at the edges of the array 242 or in the array 242 between the patterns 202a and 202b. In the example shown in FIG. 9, small pixels 214 are defined in less than about a third of the entire array 242; thus, a large amount of time required for the OPC calculations is saved.

Figure 10:
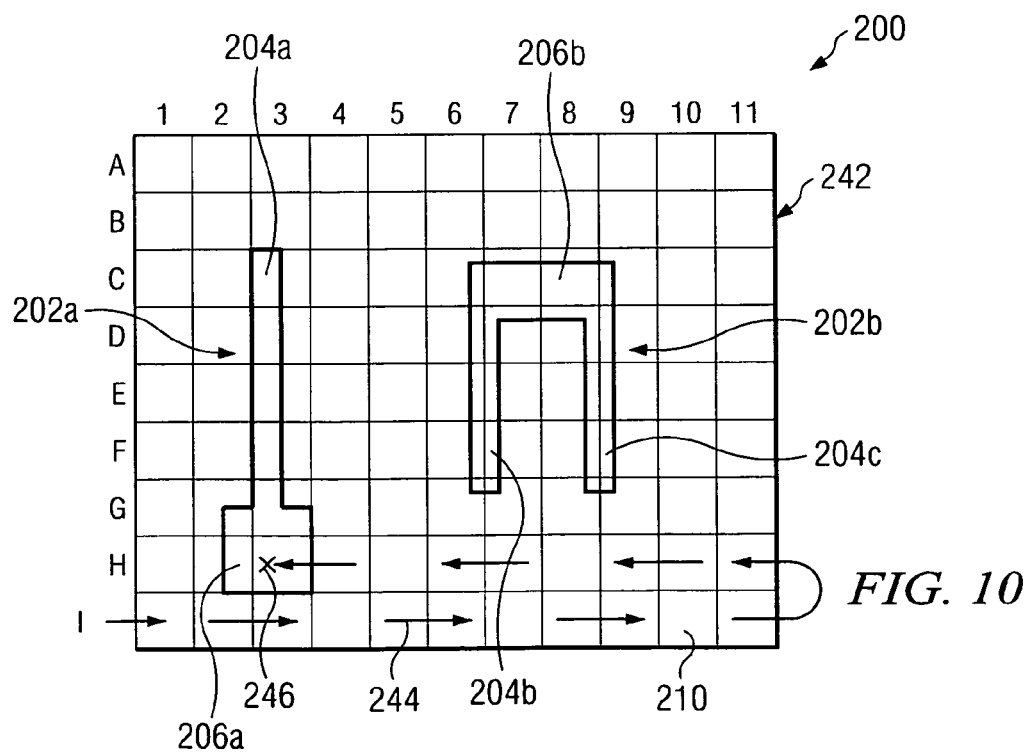
FIG. 10 shows an embodiment of the present invention wherein a design layout is scanned from side to side first using a larger pixel size until a feature is detected.
Figure 11:
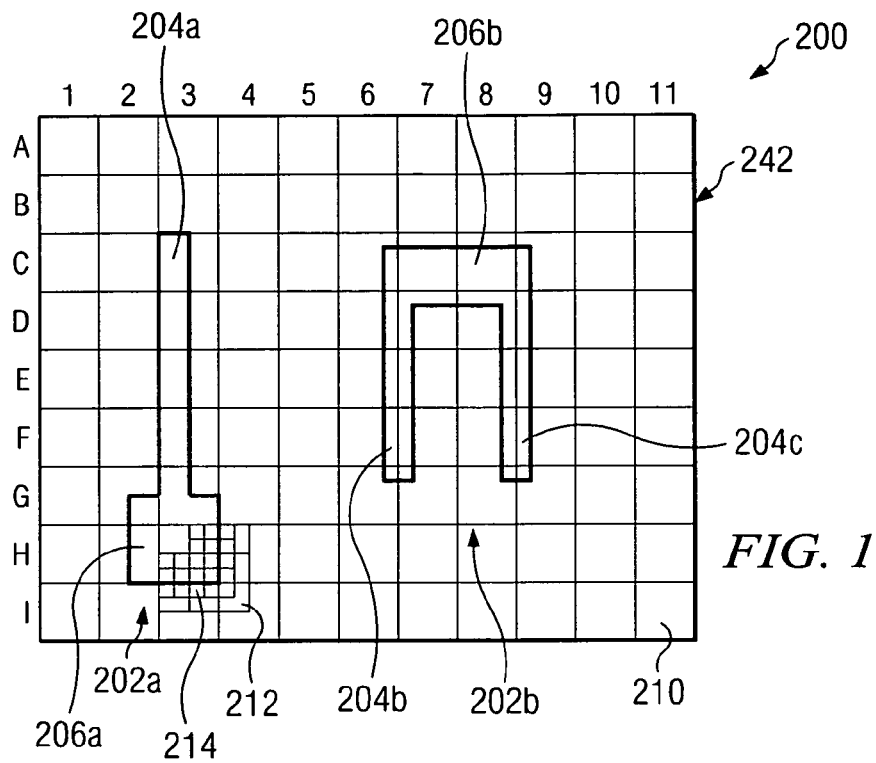
FIG. 11 illustrates that when a feature is detected, calculations are made at smaller pixel sizes.

FIGS. 10 and 11 show an algorithm 243 (see FIG. 4) in accordance with another embodiment of the present invention. Again, the algorithm 243 is preferably stored in a memory 245 of an OPC tool 240 and is implemented by an OPC tool 240 on a design layout also stored in the memory 245 of the OPC tool 240. FIG. 10 illustrates that the design layout is first divided into an array 242 of large pixels 210, and the array 242 is scanned (indicated at 244) pixel 210 by pixel 210 from left to right, and then right to left, row by row, until a pattern 202a or 202b is detected. When a pattern 202a or 202b is detected, the scanning 244 is stopped, e.g., at 246 when the pixel 210 at location H3 in the array 242 is reached. Referring to FIG. 11, smaller pixels 212 and/or 214 are then defined within the pixel 210 at location H3 and also within pixels 210 at locations H4, 14, and 13, as shown, proximate the edges of the patterns 202a and 202b. Calculations of OPC are then made at the smaller pixel sizes 212 and/or 214.

Note that the result of the algorithm 243 shown in FIGS. 7 through 9 and the algorithm 243 shown in FIGS. 10 and 11 is the same: smaller pixels 212 and/or 214 are defined at the edges of the patterns 202a and 202b. However, in the embodiment shown in FIGS. 7 through 9, the pixels are defined for the entire array 242 first for large pixels 210 and then for smaller pixels 212 and/or 214. In the embodiment shown in FIGS. 10 through 11, only one scan is performed of the entire array 242, e.g. of the large pixels 210, and as the pattern 202a and 202b edges are found, the division into smaller pixels 212 and/or 214 is defined. After the smaller pixels 212 and/or 214 are defined, then the OPC corrections may be calculated, or as the scan progresses, the OPC calculations may be simultaneously performed.

Figure 12:
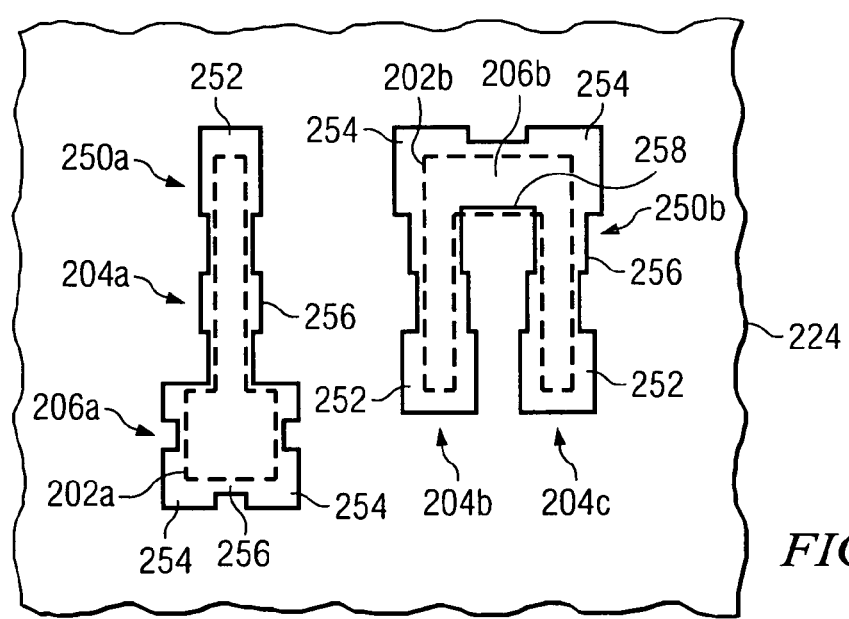
FIG. 12 shows a lithography mask having optical proximity corrections made to the patterns in accordance with a preferred embodiment of the present invention.

The OPC corrections involve modifying the patterns 202a and 202b for features, by moving the edges of the patterns 202a and 202b appropriately so that a feature will have the desired shape on a semiconductor device. FIG. 12 shows a lithography mask 224 having optical proximity corrections made to the patterns 202a and 202b in accordance with a preferred embodiment of the present invention. The original patterns 202a and 202b are shown in phantom. The patterns containing the OPC corrections are shown at 250a and 250b. Serifs 252 may be added at the ends of conductive line portions 204a, 204b, and 204c of the patterns 202a and 202b. Corners may be extended on portions of the patterns 202a and 202b, as shown at 254. Portions of the patterns may be extended outwardly from the patterns 202a and 202b or made larger, as shown at 256. Other portions of the patterns 202a and 202b may be extended inwardly from the patterns 202a and 202b or made smaller, as shown at 258.

Figure 13:
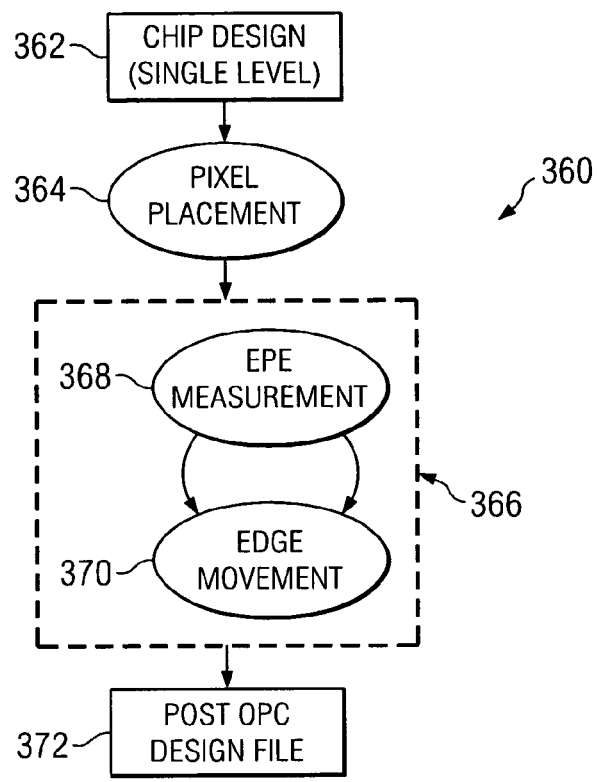
FIG. 13 shows a flow chart in accordance with an embodiment of the present invention.

FIG. 13 shows a flow chart 360 in accordance with an embodiment of the present invention. First, a chip (e.g., integrated circuit) design is provided or determined, as shown at 362. A design layout for a single level, e.g., a design for one material layer of a semiconductor device (such as device 401 shown in FIG. 14) design is input into the system or OPC tool 240 (shown in FIG. 4). The novel pixel placement using multiple size pixels in accordance with embodiments of the present invention described herein is performed, as shown at 364. Then optical proximity correction is performed, e.g., as shown at 366, by repeatedly, iteratively, measuring edge placement error (EPE) 368 and moving the edges 370 of the patterns. In the EPE 368 step, the OPC 240 software calculates the predicted wafer image and measures the error between the target image and the simulated contour. With each iteration, the software (e.g., the processor 247 of the OPC tool 240 shown in FIG. 4) follows the instructions of the algorithm 243. After determining the EPE (step 368), the OPC tool 240 software moves the edge piece corresponding to the initial fragmentation in respect to the EPE. Thus, the next iteration should have a smaller EPE. The OPC tool 240 software repeats these procedures until it reaches a sufficient accuracy, e.g., a small or zero EPE for all of the smallest pixel sizes. Then the resulting adjusted design is stored, e.g., in a post OPC design file, as shown at 372, and a lithography mask 224 is manufactured that includes the OPC, as shown in FIG. 12.

Figure 14:
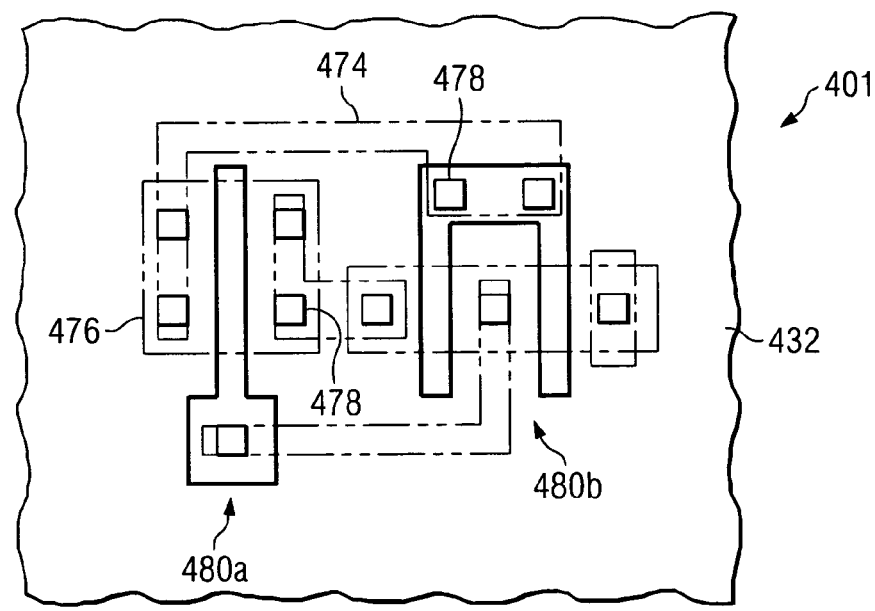
FIG. 14 shows a semiconductor device manufactured using a lithography mask containing optical proximity corrections determined using the methods described herein.

FIG. 14 shows a semiconductor device 401 manufactured using a lithography mask 224 (FIG. 12) containing optical proximity corrections determined using the methods described herein. The semiconductor device 401 includes a plurality of material layers formed over a workpiece 432. For example, to manufacture the device 401, the workpiece 432 is first provided. The workpiece 432 may comprise a semiconductor substrate comprising silicon or other semiconductor materials covered by an insulating layer, for example. The workpiece 432 may also include other active components or circuits, not shown. The workpiece 432 may comprise silicon oxide over single-crystal silicon, for example. The workpiece 432 may include other conductive layers or other semiconductor elements, e.g., transistors, diodes, etc. Compound semiconductors, GaAs, InP, Si/Ge, or SiC, as examples, may be used in place of silicon. The workpiece 432 may comprise a silicon-on-insulator (SOI) substrate, for example.

A material layer to be patterned may be deposited or formed over the workpiece 432. Alternatively, the workpiece 432 may be altered using the layer of photoresist as a mask, for example. A layer of photoresist (e.g., such as photoresist 234 shown in FIG. 3) is formed over the material layer (or the workpiece 432), and the layer of photoresist 234 is exposed using the lithography mask 224 (shown in FIGS. 3 and 12). The layer of photoresist 234 is developed, and portions of the material layer are etched away using the layer of photoresist 234 as a mask, patterning the material layer. The layer of photoresist 234 is then removed.

In the embodiment shown, the features 480a and 480b are formed by the adjusted, corrected patterns 250a and 250b of the original patterns 202a and 202b of the lithography mask 224 shown in FIG. 12. The features 480a and 480b in the example shown may comprise a gate contact layer for transistors, for example, although other types of features 480a and 480b may also be formed.

Preferably, the novel OPC calculation methods described herein are performed for the design layout of one or more material layers of a semiconductor device 401. The novel OPC calculation methods described herein may be performed for lithography masks for every material layer of a semiconductor device 401, for example. In FIG. 12, other material layers 474 and 476 are shown in phantom, for example, disposed above and below the material layer having the patterned features 480a and 480b. The features 480a and 480b may comprise a layer of polysilicon and may comprise a gate contact layer; regions 476 may comprise diffusion regions within the workpiece 432; regions 474 may comprise a metallization layer; and regions 478 may comprise contacts or vias, as examples. Other types of structures may also be formed, for example.

Embodiments of the present invention include methods of determining optical proximity correction, methods of manufacturing lithography masks, lithography masks manufactured using the methods described herein, methods of manufacturing semiconductor devices using the lithography masks described herein, and semiconductor devices manufactured using the lithography masks. Embodiments of the present invention also include systems, methods, and algorithms of optical proximity correction.

For example, in one embodiment, a method of determining optical proximity correction comprises providing a design for a lithography mask, the design comprising a layout for a material layer of a semiconductor device, calculating a predicted wafer image producible by the design for the lithography mask, and measuring an amount of error between a target image and the calculated predicted wafer image over a plurality of pixels of the predicted wafer image, wherein the plurality of pixels comprises a plurality of different sizes. The method may include determining an amount to alter the design for the lithography mask using the measured amount of error between the target image and the calculated predicted wafer image, and altering the design for the lithography mask by the amount determined. Calculating the predicted wafer image producible by the altered design for the lithography mask and measuring an amount of error between a target image and the calculated predicted wafer image over at least a portion of the plurality of pixels of the predicted wafer image may be repeated until the target image is substantially achieved. Providing the design for the lithography mask may comprise providing a design comprising a plurality of patterns for features, and altering the design for the lithography mask may comprise adding serifs to the plurality of patterns, or decreasing or increasing a width of the plurality of patterns, for example.

Measuring the amount of error between the target image and the calculated predicted wafer image over the plurality of pixels of the predicted wafer image may comprise scanning the entire layout over a plurality of first pixels to determine the location of the plurality of patterns, the first pixels having a first size, and scanning the plurality of first pixels in which a pattern was found over a plurality of second pixels, the second pixels comprising a second size, the second size being less than the first size. Calculating the predicted wafer image producible by the design for the lithography mask and measuring the amount of error between the target image and the calculated predicted wafer image may then be performed for only the second pixels.

Measuring the amount of error between the target image and the calculated predicted wafer image over the plurality of pixels of the predicted wafer image may comprise scanning the predicted wafer image at a first pixel size until a pattern is detected, and then scanning the first pixel in which the pattern was detected at a second pixel size, the second pixel size being smaller than the first pixel size.

Embodiments of the present invention also include methods of manufacturing lithography masks. In one embodiment, a design for a layout of a material layer of a semiconductor device is provided, the design comprising a plurality of patterns. A predicted wafer image producible by the design is calculated, and an amount of error between a target image and the calculated predicted wafer image is measured over a plurality of pixels of the predicted wafer image, the plurality of pixels comprising a plurality of different sizes. The method includes determining an amount to alter the design using the measured amount of error between the target image and the calculated predicted wafer image, altering the design by the amount determined, and then manufacturing a lithography mask using the altered design.

The plurality of pixels may comprise a first size proximate the plurality of patterns and a second size a distance away from the plurality of patterns, the second size being greater than the first size. The second size may be greater than the first size by about 20 to 80%, for example. The plurality of pixels may comprise a third size proximate the edges of the plurality of patterns, wherein the third size is smaller than the second size or the first size. Measuring the amount of error between the target image and the calculated predicted wafer image may be performed on only pixels comprising the third size. Altering the design as a result of the OPC determined may comprise inwardly or outwardly moving an edge of at least one of the plurality of patterns of the design.

In accordance with one embodiment of the present invention, a method of manufacturing a semiconductor device comprises providing a workpiece, providing a lithography mask manufactured using an optical proximity correction method in which calculations for optical proximity correction are made over a plurality of pixels, the plurality of pixels comprising a plurality of different sizes. The method includes affecting the workpiece using the lithography mask. Providing the workpiece may comprise providing a workpiece having a layer of photosensitive material disposed thereon, and affecting the workpiece using the lithography mask may comprise patterning the layer of photosensitive material using the lithography mask. Providing the workpiece may comprise providing a workpiece having a material layer disposed thereon, the layer of photosensitive material being disposed over the material layer. The layer of photosensitive material may be exposed, and affecting the workpiece may comprise altering the material layer through the patterned layer of photosensitive material. Altering the material layer may comprise etching the material layer, implanting the material layer with a substance, or depositing another material layer over the material layer, as examples. The material layer may comprise a conductive material, a semiconductive material, or an insulating material, as examples, although other materials may also be used. Embodiments of the present invention also include semiconductor devices manufactured in accordance with the methods and lithography masks manufactured as described herein.

The novel algorithm 243 shown in FIG. 4 preferably comprises an algorithm for determining optical proximity correction (OPC) of a layout for a material layer, the layout for the material layer comprising a plurality of patterns. The algorithm preferably comprises defining a first pixel size, applying a grid comprising a plurality of first pixels comprising the first pixel size to the layout for the material layer, and analyzing each first pixel to determine if at least a portion of the plurality of patterns is located within each first pixel. Then, for first pixels in which a portion of the plurality of patterns is located, the first pixels are divided into a plurality of second pixels, the second pixels being smaller than the first pixels. Optical proximity correction is then performed on at least a portion of and on at least some of the second pixels.

The algorithm 243 may further comprise dividing the first pixels into a plurality of second pixels for first pixels adjacent the first pixels in which a portion of the plurality of patterns is located, and optical proximity correction may be performed on the first pixels adjacent the first pixels in which a portion of the plurality of patterns is located. The algorithm 243 may further comprise analyzing each second pixel to determine if an edge region of at least a portion of the plurality of patterns is located within each second pixel, and for second pixels in which an edge region is located, the second pixels are divided into a plurality of third pixels, the third pixels being smaller than the second pixels. Optical proximity correction may then be performed on at least a portion of and on at least some of the third pixels.

Advantages of embodiments of the invention include using various and multiple pixel sizes to significantly reduce the total number of calculations required for dense OPC applications. Various pixel sizes are used in distinguished regions of a lithography mask. A grid of very small pixels is used in areas requiring high accuracy, and a grid with larger pixels is used in more stable and homogeneous imaging areas. Embodiments of the present invention result in improved and reduced runtime for OPC calculations, while maintaining a high amount of accuracy in OPC calculations. The use of multiple pixel sizes in OPC calculations described herein results in a reduced total number of calculation sites, resulting in reduced OPC runtime and improved OPC accuracy.

In some applications, the most critical areas of the lithography mask receive the smallest pixel size for optimum accuracy. The use of small pixels around the edges of design patterns ensure a high accuracy in OPC calculation on those regions, while the use of large pixels in homogenous areas reduces the OPC run time.

Embodiments of the present invention are useful in semiconductor products that require high OPC accuracy. As examples, embodiments of the present invention may be implemented in the fabrication of devices including transistors, isolation regions, capacitors, memory devices, conductive lines, power devices, logic devices, peripheral circuitry, at least portions of other types of electrical devices, and/or combinations thereof. Semiconductor devices having higher yields and improved electrical performance may be manufactured with the use of the novel OPC methods described herein, for example.

Embodiments of the present invention may be implemented in optical proximity correction for many different types of lithography masks. Some examples of some types of masks that embodiments of the present invention may be implemented in include binary masks, phase-shifting masks, alternating phase-shifting masks, reflective masks, transmissive masks, and/or combinations thereof.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece;
   providing a lithography mask manufactured using an optical proximity correction method in which calculations for optical proximity correction are made by a computer processor over a plurality of pixels of at least two different pixel sizes, wherein the plurality of pixels comprises a first size proximate a plurality of patterns, wherein the plurality of pixels comprises a second size proximate edges of the plurality of patterns, and wherein the second size is smaller than the first size, wherein providing the lithography mask comprises measuring an amount of error between a target image and a predicted wafer image only over pixels comprising the second size;
   coating the workpiece with a photoresist; and
   changing a surface of the workpiece based upon patterning the photoresist with the lithography mask.

2. The method according to claim 1, wherein providing the workpiece comprises providing a workpiece having a material layer disposed thereon, the photoresist being coated over the material layer, and wherein changing a surface of the workpiece comprises altering the material layer through the patterned photoresist.

3. The method according to claim 2, wherein altering the material layer comprises etching the material layer, implanting the material layer with a substance, or depositing another material layer over the material layer.

4. The method according to claim 2, wherein the material layer comprises a conductive material, a semiconductive material, or an insulating material.

5. A semiconductor device manufactured in accordance with the method of claim 2.

6. The method of claim 1, wherein providing the lithography mask comprises:
   providing a design for the lithography mask, the design comprising a layout for a material layer of the semiconductor device;
   calculating the predicted wafer image producible by the design for the lithography mask; and
   measuring the amount of error between the target image and the predicted wafer image over a plurality of pixels of the predicted wafer image, wherein the plurality of pixels comprises a plurality of different sizes.

7. The method according to claim 6, wherein providing the lithography mask further comprises:
   determining an amount to alter the design for the lithography mask using the measured amount of error between the target image and the predicted wafer image; and
   altering the design for the lithography mask by the amount determined.

8. The method according to claim 7, wherein providing the lithography mask further comprises repeating calculating the predicted wafer image producible by the altered design for the lithography mask and measuring an amount of error between a target image and the calculated predicted wafer image over at least a portion of the plurality of pixels of the predicted wafer image, wherein the repeated calculating is stopped if the measured amount of error is below a predetermined error threshold.

9. The method according to claim 7, wherein providing the design for the lithography mask comprises providing a design comprising a plurality of patterns for features, and wherein altering the design for the lithography mask comprises adding serifs to the plurality of patterns, or decreasing or increasing a width of the plurality of patterns.

10. The method according to claim 6, wherein providing the design for the lithography mask comprises providing a design comprising a plurality of patterns for features, wherein measuring the amount of error between the target image and the calculated predicted wafer image over the plurality of pixels of the predicted wafer image comprises scanning the predicted wafer image at a first pixel size until a pattern is detected, and then scanning a first pixel in which the pattern was detected at a third pixel size, the third pixel size being smaller than the first pixel size.

11. The method according to claim 6, wherein providing the lithography mask comprises:
providing a design for a layout of a material layer of the semiconductor device, the design comprising a plurality of patterns;
calculating the predicted wafer image producible by the design;
measuring the amount of error between the target image and the predicted wafer image over a plurality of pixels of the predicted wafer image, the plurality of pixels comprising a plurality of different sizes;
determining an amount to alter the design using the measured amount of error between the target image and the calculated predicted wafer image;
altering the design by the amount determined; and
manufacturing a lithography mask using the altered design.

12. The method according to claim 11, wherein altering the design comprises inwardly or outwardly moving an edge of at least one of the plurality of patterns of the design.

13. The method according to claim 1, wherein the plurality of pixels further comprise a third size at a distance away from the plurality of patterns, the third size being greater than the first size.

14. A method of manufacturing a semiconductor device, the method comprising:
providing a design for a lithography mask, the design comprising a layout for a material layer of the semiconductor device;
using a computer processor, calculating a predicted wafer image producible by the design for the lithography mask;
measuring an amount of error between a target image and the calculated predicted wafer image over a plurality of pixels of the predicted wafer image, wherein the predicted wafer image is calculated over the plurality of pixels, wherein the plurality of pixels comprises a first pixel size proximate a plurality of patterns, wherein the plurality of pixels comprises a second pixel size proximate edges of the plurality of patterns, wherein the second pixel size is smaller than the first pixel size, and wherein the amount of error is measured only over pixels comprising the second pixel size;
manufacturing a photomask based on the design and the measured amount of error;
coating a wafer with a photoresist;
patterning the photoresist using the photomask; and
changing a surface of the wafer based upon the patterning.

15. The method according to claim 14, further comprising:
determining an amount to alter the design for the lithography mask using the measured amount of error between the target image and the calculated predicted wafer image; and
altering the design for the lithography mask by the amount determined.

16. The method according to claim 15, further comprising repeating calculating the predicted wafer image producible by the altered design for the lithography mask and measuring an amount of error between a target image and the calculated predicted wafer image over at least a portion of the plurality of pixels of the predicted wafer image.

17. The method according to claim 15, wherein providing the design for the lithography mask comprises providing a design comprising a plurality of patterns for features, and wherein altering the design for the lithography mask comprises adding serifs to the plurality of patterns, or decreasing or increasing a width of the plurality of patterns.

18. The method according to claim 15, wherein providing the design for the lithography mask comprises providing a design comprising features with optical proximity corrections.

19. A method of manufacturing a semiconductor device, the method comprising:
providing a design for a layout of a material layer of a semiconductor device, the design comprising a plurality of patterns;
using a computer processor, calculating a predicted wafer image producible by the design;
measuring an amount of error between a target image and the calculated predicted wafer image over a plurality of pixels of the predicted wafer image, wherein the plurality of pixels comprises a first pixel size proximate a plurality of patterns, wherein the plurality of pixels comprises a second pixel size proximate edges of the plurality of patterns, wherein the second pixel size is smaller than the first pixel size, and wherein the amount of error is measured only over pixels comprising the second pixel size;
determining an amount to alter the design using the measured amount of error between the target image and the calculated predicted wafer image;
altering the design by the amount determined;
manufacturing a lithography mask using the altered design;
coating a wafer with a photoresist;
patterning the photoresist using the lithography mask; and
changing a surface of the wafer based upon the patterning.

20. The method according to claim 19, wherein the plurality of pixels comprises a first size proximate the plurality of patterns and a third size a distance away from the plurality of patterns, the third size being greater than the first size.

21. The method according to claim 20, wherein the third size is greater than the first size by about 20 to 80%.

22. The method according to claim 19, wherein altering the design comprises inwardly or outwardly moving an edge of at least one of the plurality of patterns of the design.

23. The method according to claim 19, wherein altering the design comprises providing a design comprising features with optical proximity corrections.

24. A method of manufacturing a semiconductor device, the method comprising:
providing a lithography mask manufactured using an optical proximity correction method in which calculations for optical proximity correction are made by a computer processor over a plurality of pixels of at least two different pixel sizes, wherein providing a lithography mask comprises:
providing a design having a plurality of patterns for the lithography mask, the design comprising a layout for a material layer of the semiconductor device,
calculating a predicted wafer image producible by the design for the lithography mask, and
measuring an amount of error between a target image and the calculated predicted wafer image over the plurality of pixels of the predicted wafer image by scanning the entire layout over first pixels having a first size to determine a location of the plurality of patterns, and scanning the plurality of first pixels in which a pattern was found over second pixels having a second size, the second size being less than the first size.

25. The method according to claim 24, wherein the second size is greater than the first size by about 20 to 80%.

26. The method of claim 24, further comprising:

coating a workpiece with a photoresist; and changing a surface of the workpiece based upon patterning the photoresist with the lithography mask.

27. The method of claim 24, wherein the calculating and the measuring are performed for only the second pixels.

28. A method of manufacturing a semiconductor device, the method comprising:

providing a design for a lithography mask, the design comprising a plurality of patterns for a material layer of the semiconductor device;

using a computer processor, calculating a predicted wafer image producible by the design for the lithography mask, wherein the predicted wafer image is calculated over a plurality of pixels;

measuring an amount of error between a target image and the calculated predicted wafer image over the plurality of pixels by scanning the entire layout over first pixels having a first size to determine a location of the plurality of patterns, and scanning the plurality of first pixels in which a pattern was found over second pixels having a second size, the second size being less than the first size;

manufacturing a photomask based on the design and the measured amount of error;

coating a wafer with a photoresist;

patterning the photoresist using the photomask; and changing a surface of the wafer based upon the patterning.

29. The method of claim 28, wherein calculating a predicted wafer image is performed for only the second pixels.

30. The method of claim 28, wherein measuring an amount of error is performed for only the second pixels.

* * * * *